(12) United States Patent
Wu

(10) Patent No.: US 8,371,666 B2
(45) Date of Patent: Feb. 12, 2013

(54) CONTAINER DATA CENTER

(75) Inventor: Hui-Feng Wu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 139 days.

(21) Appl. No.: 12/965,713

(22) Filed: Dec. 10, 2010

(65) Prior Publication Data

US 2012/0104919 A1    May 3, 2012

(30) Foreign Application Priority Data

Nov. 1, 2010  (TW) .............................. 99137388 A

(51) Int. Cl.
A47B 88/00      (2006.01)
(52) U.S. Cl. .............................. 312/334.28; 312/334.24
(58) Field of Classification Search ............. 312/334.28, 312/270.3, 304, 317.1, 334.23, 334.24, 334.25, 312/334.26, 334.27, 334.29, 350, 334.31, 312/334.32, 334.33, 201, 223.1; 211/26; 361/724, 727; 104/106, 110, 111
See application file for complete search history.

(56) References Cited

U.S. PATENT DOCUMENTS

| | | | | |
|---|---|---|---|---|
| 4,023,236 A * | 5/1977 | Azuma | ............................. | 16/97 |
| 4,138,107 A * | 2/1979 | Janis | ............................. | 473/426 |
| 4,993,328 A * | 2/1991 | Wendt et al. | .................. | 105/150 |
| 5,443,312 A * | 8/1995 | Schluter | .................... | 312/334.27 |
| 5,967,346 A * | 10/1999 | Price, Jr. | ........................ | 211/162 |
| 6,027,190 A * | 2/2000 | Stewart et al. | ................ | 312/201 |
| 6,412,892 B1 * | 7/2002 | Bonat | ....................... | 312/334.47 |
| 6,688,708 B1 * | 2/2004 | Janson | .......................... | 312/200 |
| 7,042,732 B2 * | 5/2006 | Hung | ............................ | 361/727 |
| 7,257,925 B2 * | 8/2007 | Manogue et al. | ................. | 52/29 |
| 7,475,955 B2 * | 1/2009 | Dressendorfer et al. | . | 312/334.26 |
| 7,735,190 B2 * | 6/2010 | Welsch et al. | ................. | 16/94 R |
| 7,832,816 B2 * | 11/2010 | Compagnucci | .......... | 312/334.24 |
| 8,109,581 B1 * | 2/2012 | Lazenby | ....................... | 312/311 |
| 2003/0094884 A1 * | 5/2003 | Sobol | ............................ | 312/201 |
| 2006/0001337 A1 * | 1/2006 | Walburn | ................. | 312/334.27 |
| 2008/0190876 A1 * | 8/2008 | Janson et al. | ................. | 211/162 |
| 2009/0179532 A1 * | 7/2009 | Pan | ............................. | 312/201 |
| 2010/0005998 A1 * | 1/2010 | Kempf | .......................... | 105/150 |
| 2012/0104918 A1 * | 5/2012 | Peng et al. | ............... | 312/334.27 |
| 2012/0104920 A1 * | 5/2012 | Peng et al. | ............... | 312/334.28 |

* cited by examiner

Primary Examiner — James O Hansen
Assistant Examiner — Daniel Rohrhoff
(74) Attorney, Agent, or Firm — Altis Law Group, Inc.

(57) ABSTRACT

A container data center includes a mobile container, two rails, two supports, and a rack. The container includes a top wall and a bottom wall opposite to the top wall. The rails are attached to the top wall facing the bottom wall. The supports are attached to the bottom wall facing the top wall, corresponding to the rails. The rack is received in the container. The rack includes a top plate, a bottom plate opposite to the top plate, two rows of first slide members attached to the top plate, and two rows of second slide members attached to the bottom plate. The rows of first slide member slidably resist against the rails, and the rows of second slide member slidably resist against the supports.

8 Claims, 8 Drawing Sheets

CONTAINER DATA CENTER

BACKGROUND

1. Technical Field

The present disclosure relates to a container data center.

2. Description of Related Art

With increasing heavy duty use of on-line applications, the need for computer data centers has increased rapidly. Data centers are centralized computing facilities that include a mobile container, and many server racks or shelves holding servers received in the container. One rack or shelf with some servers can be considered a server system. When a server system breaks down, users need to maintain the system from the back. However, because of limited space in the container, accessing the back of the server systems is inconvenient and it is hard to shift the heavy systems to a more convenient orientation during servicing.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
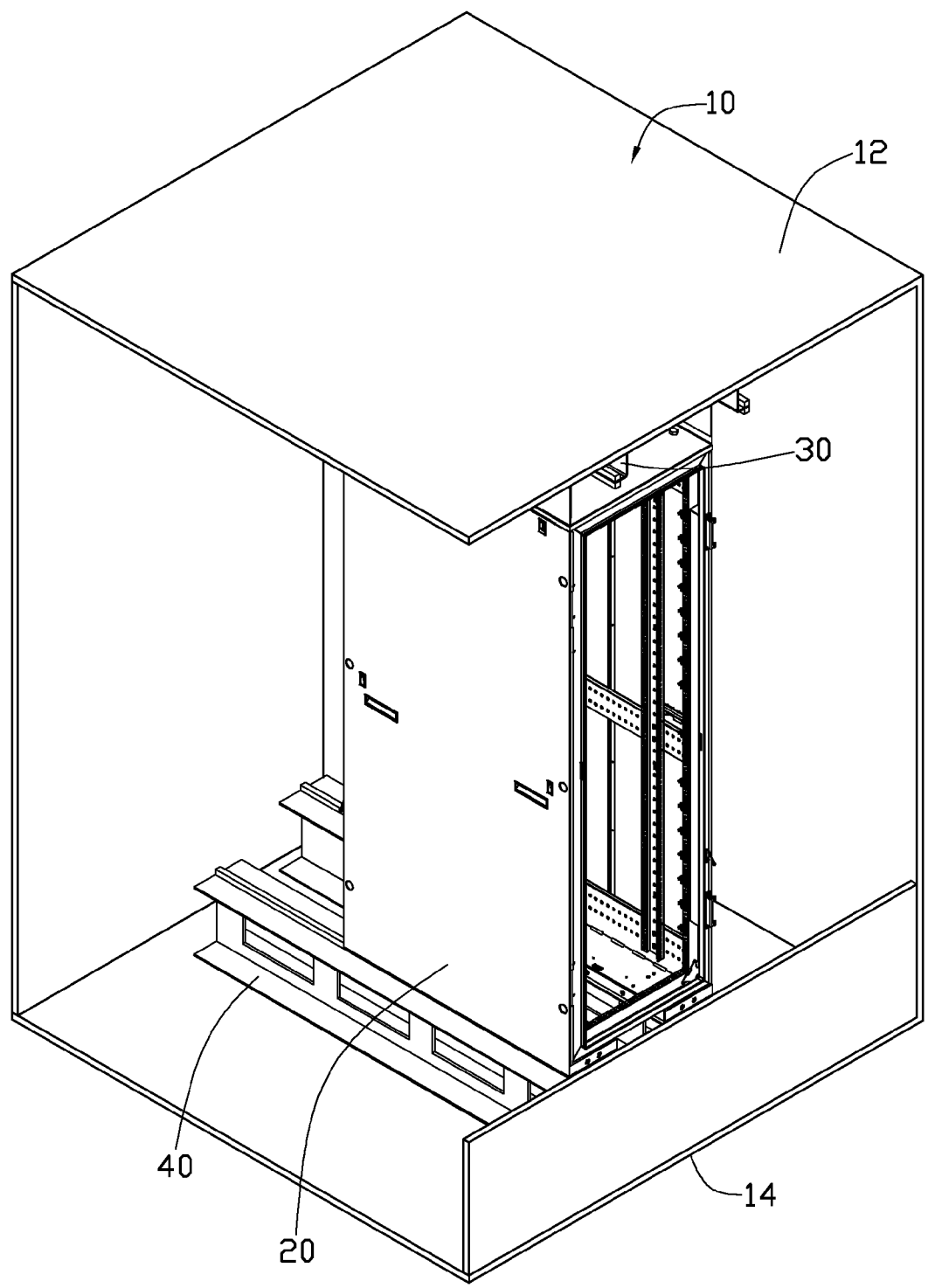
FIG. 1 is an assembled, isometric view of an exemplary embodiment of a container data center, the container data center includes a rack and a container with two supports and two rails.
Figure 2:
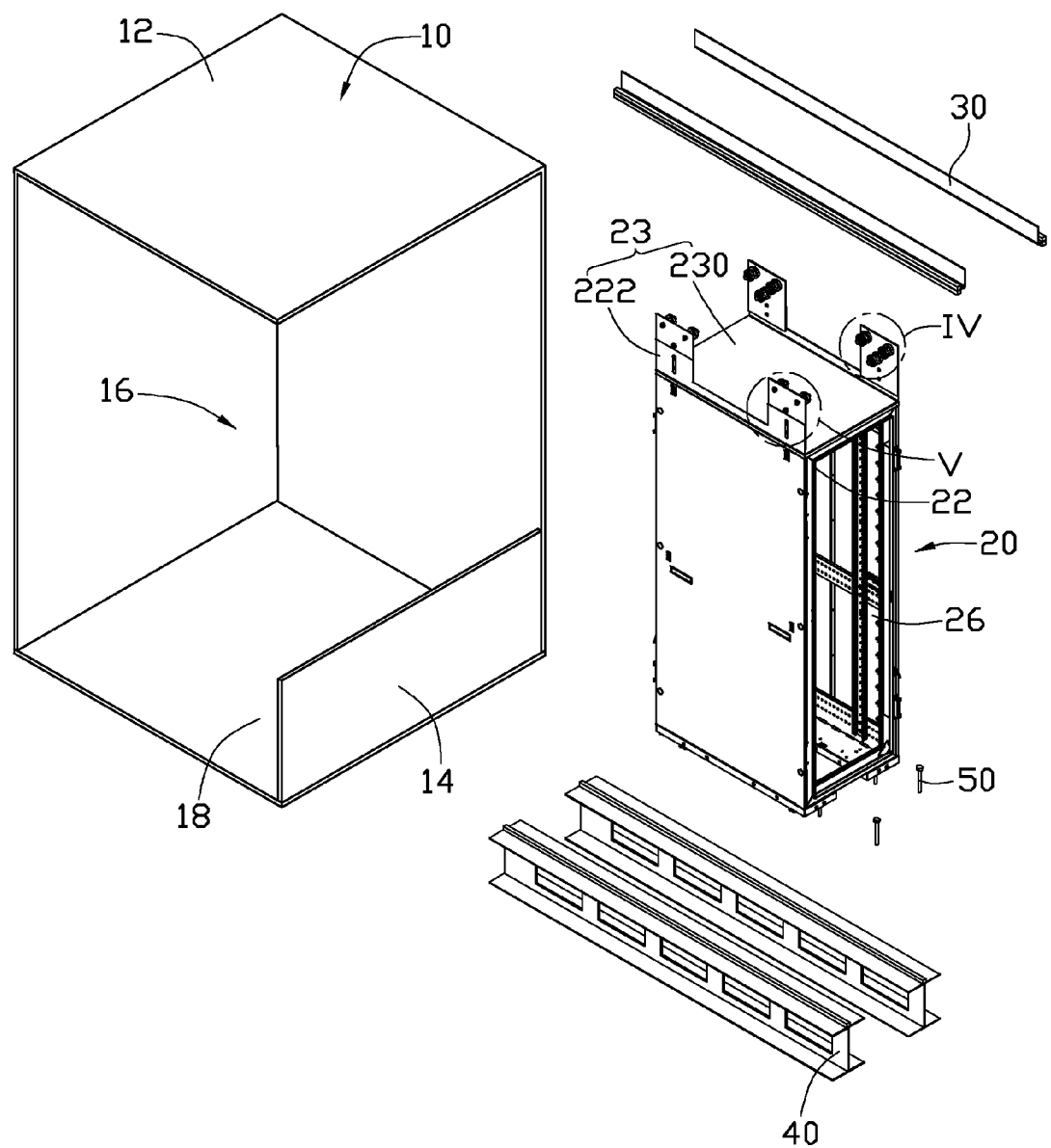
FIG. 2 is an exploded, isometric view of the container data center of FIG. 1.
Figure 3:
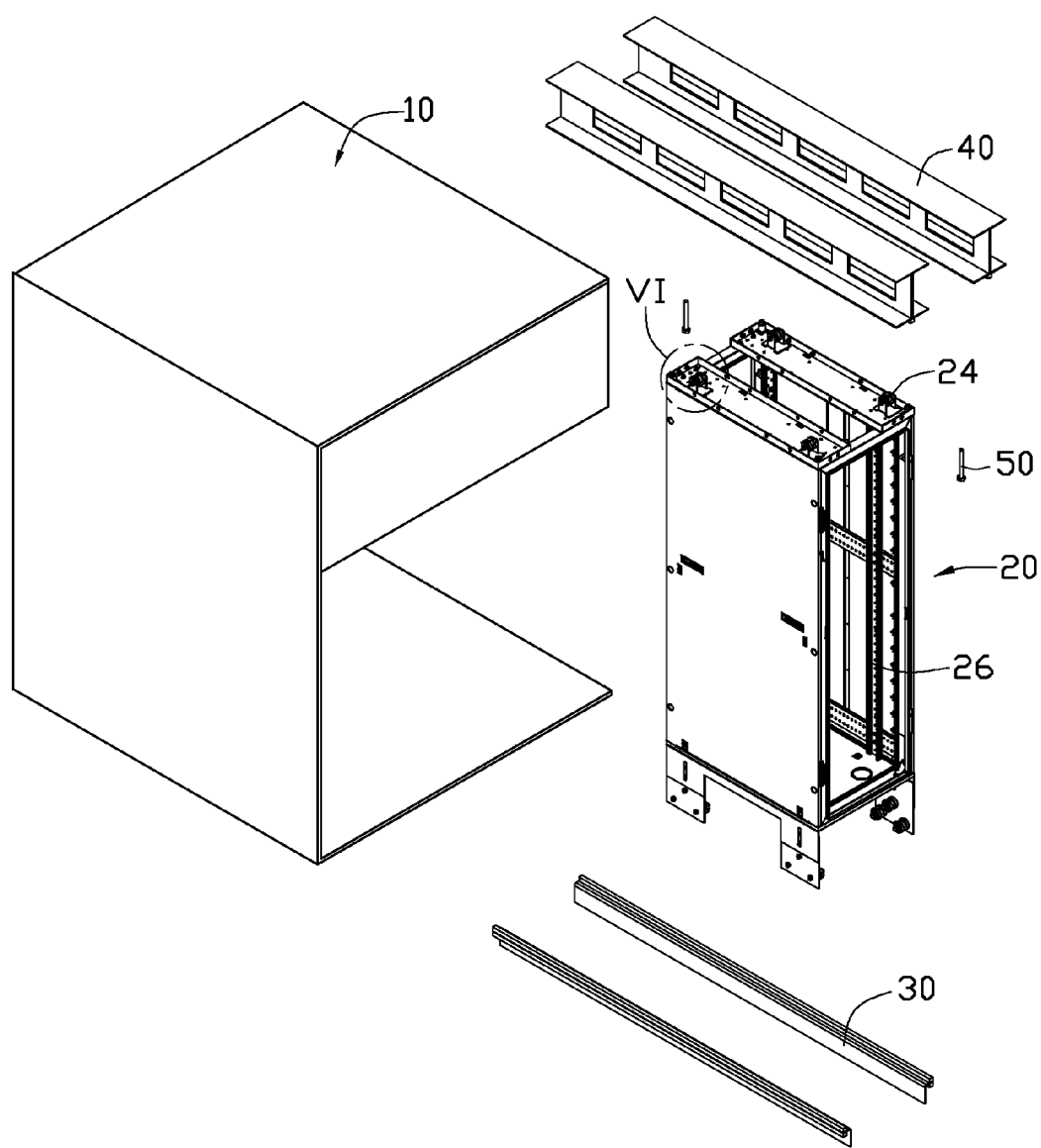
FIG. 3 is similar to FIG. 2, but an inverted view.

Referring to FIGS. 1 to 3, an embodiment of a container data center includes a mobile container 10, and a rack 20. The container 10 includes a top wall 12, and a bottom wall 14 opposite to the top wall 12. A receiving space 16 is bounded by the top wall 12 and the bottom wall 14. An inlet 18 communicating with the receiving space 16 is bounded by corresponding ends of the top wall 12 and the bottom wall 14. The container 10 further includes two parallel rails 30 and two parallel supports 40 corresponding to the rails 30. The rails 30 are attached to an inner surface of the top wall 12. The supports 40 are attached to an inner surface of the bottom wall 14, corresponding to the rails 30.

Figure 4:
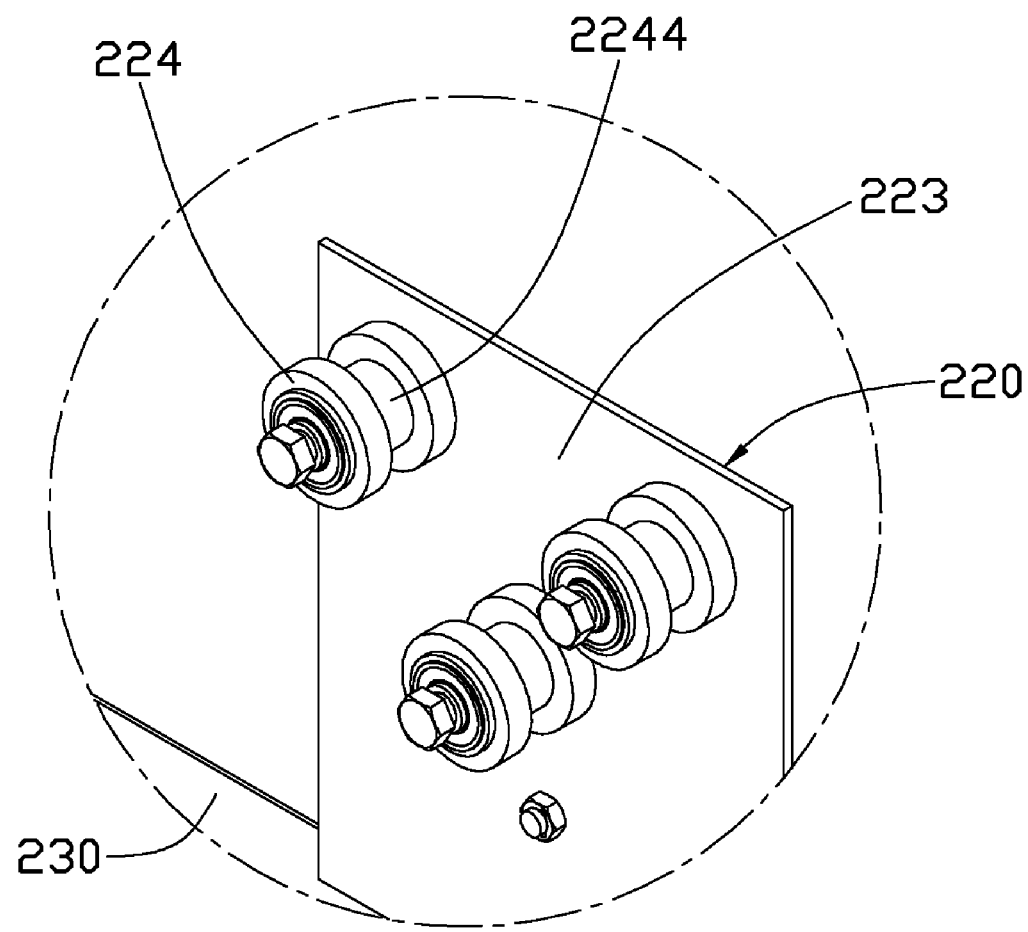
FIG. 4 is an enlarged view of the circled portion IV of FIG. 2.
Figure 5:
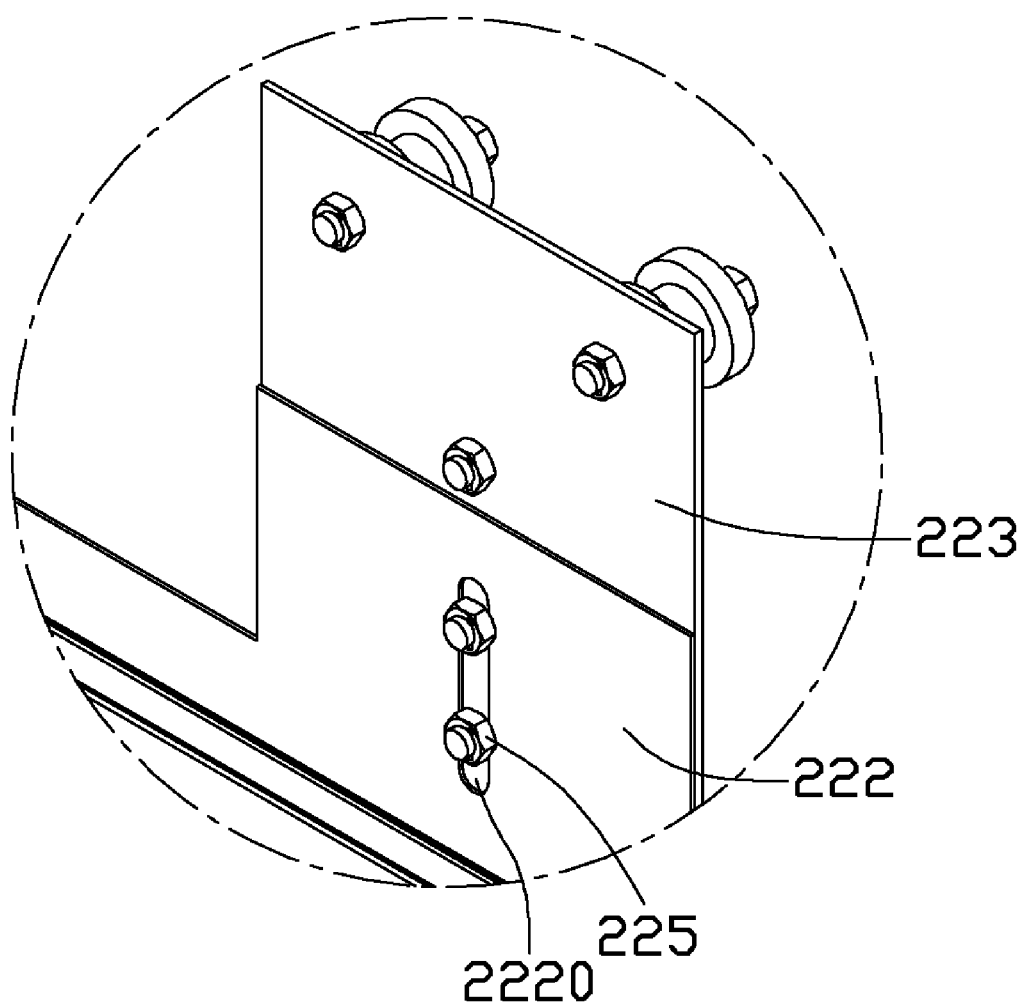
FIG. 5 is an enlarged view of the circled portion V of FIG. 2.
Figure 6:
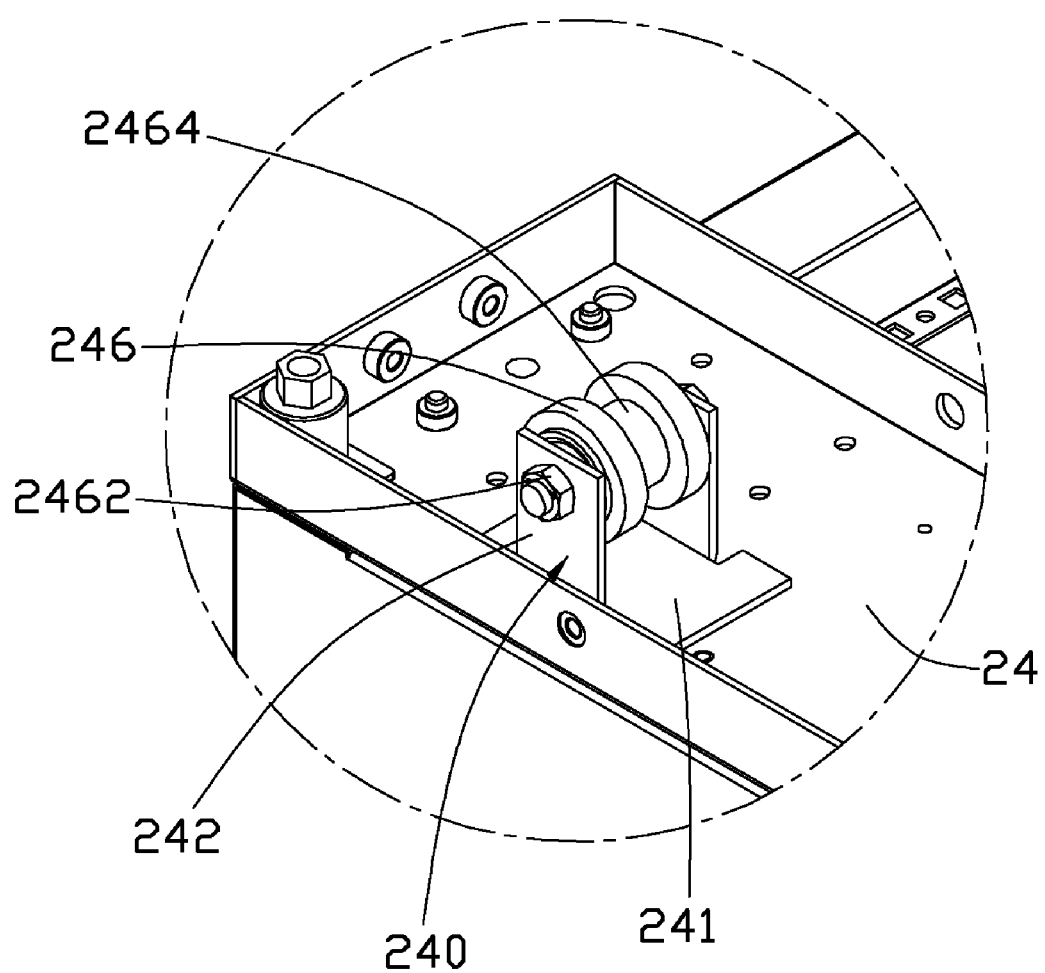
FIG. 6 is an enlarged view of the circled portion VI of FIG. 3.

Referring to FIGS. 4 to 6, the rack 20 is used to receive servers, power sources, heat dissipation devices, and includes a substantially rectangular top plate 22, and a substantially rectangular bottom plate 24 opposite to the top plate 22. A front side of the rack 20 defines an opening 26. When the rack 20 is received in the container 10, a cold aisle is defined between the front side of the rack 20 and the container 10, and a hot aisle is defined between a rear side of the rack 20 opposite to the front side and the container 10.

The top plate 22 includes a bracket 23. The bracket 23 includes a substantially rectangular-shaped base plate 230 attached to the top of the top plate 22, two pairs of tabs 222 substantially perpendicularly extending up from opposite sides of the base plate 230, and two pairs of first slide members 220 slidably mounted in the corresponding tabs 222. Each tab 222 defines a long first slide slot 2220 extending up and down.

Each first slide member 220 includes a fixing plate 223, and three pulleys 224 substantially perpendicularly connected to the fixing plate 223. The fixing plate 223 defines two fixing holes (not show), and two fasteners 225 adjustably extend though the first slide slot 2220 and engage in the fixing holes of the fixing plate 223 to adjustably fasten the fixing plate 223 to the corresponding tab 222. Two of the three pulleys 224 are arranged on an upper portion of the fixing plate 223 along a line parallel to the base plate 230, and the third pulley 224 is arranged under and between the two upper pulleys 224. Each pulley 224 defines a slide slot 2244 in a circumference of the pulley 224. In this embodiment, the three pulleys 224 are arranged in a triangle.

Two rows of second slide members 240 are attached to opposite sides of the bottom plate 24. Each row of second slide members 240 includes two second slide members 240. The two rows of second slide members 240 cooperatively form a rectangle, and each second slide member 240 is positioned at a corner of the rectangle. In this embodiment, each second slide member 240 is positioned at a corner of the bottom plate 24. Each second slide member 240 includes a bottom plate 241 mounted on the bottom plate 24 of the rack 20, two tabs 242 substantially perpendicularly extending from opposite sides of the bottom plate 241, and a pulley 246 rotatably mounted between the tabs 242 using an axel 2462. Each pulley 246 defines a slide slot 2464 in a circumference of the pulley 246.

Figure 7:
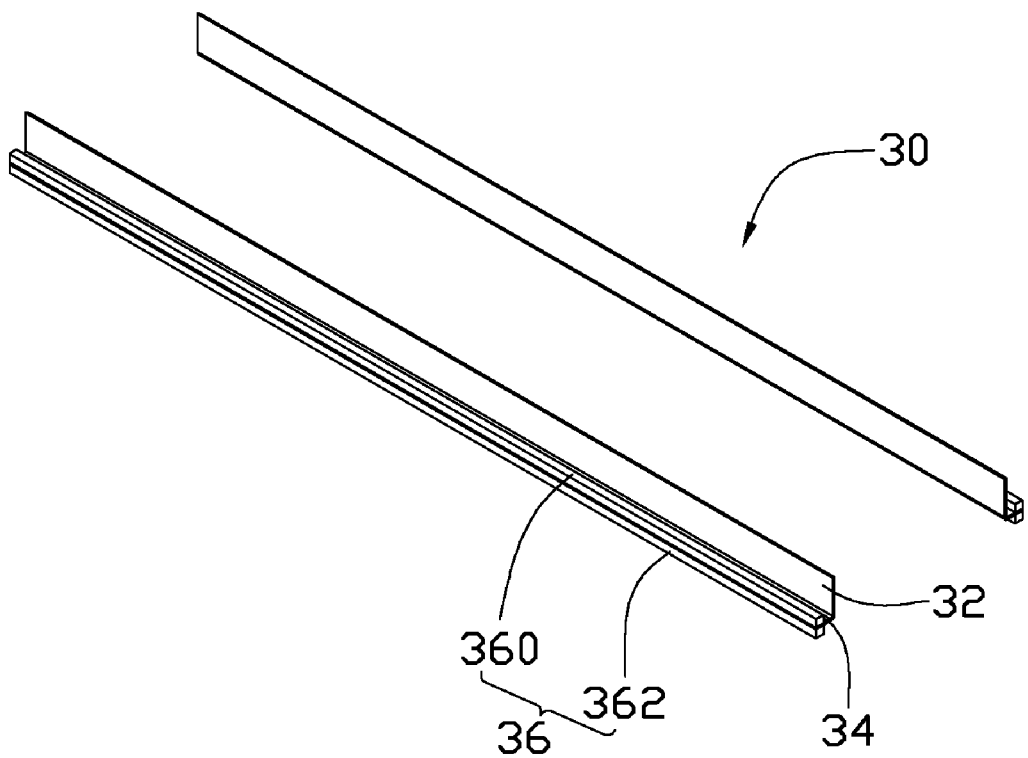
FIG. 7 is an enlarged view of the rails of FIG. 2.

Referring to FIG. 7, each rail 30 includes a fixing plate 32 substantially perpendicularly mounted to the top wall 12, a connection plate 34 substantially perpendicularly extending from a distal side of the fixing plate 32, and a slide rail 36 substantially perpendicularly extending from the connection plate 34 and parallel to the fixing plate 32. The connection plate 34 is connected to a center line of the slide rail 36 to divide the slide rail 36 into an upper slide rail 360 and a lower slide rail 362. In this embodiment, the fixing plate 32 is mounted on the top wall 12 by welding.

Figure 8:
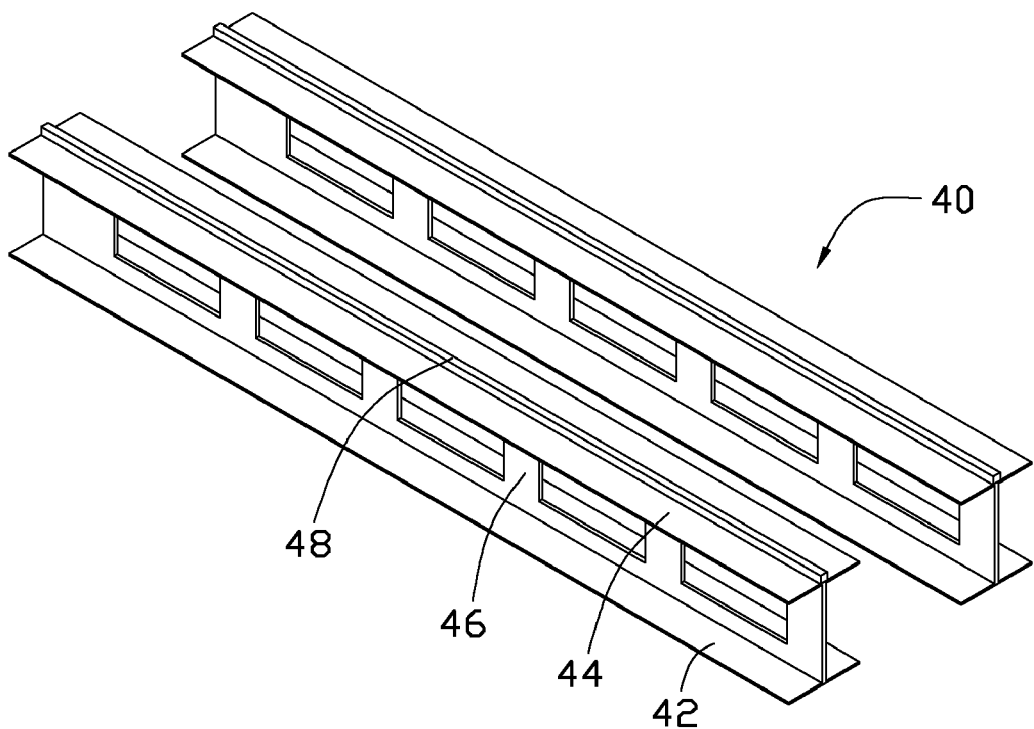
FIG. 8 is an enlarged view of the supports of FIG. 2.

Referring to FIG. 8, each support 40 is substantially I-shaped and includes a lower support plate 42, an upper support plate 44 opposite to the lower support plate 42, and a plurality of connection plates 46 substantially perpendicularly connected between center lines of the lower and upper support plates 42 and 44. The lower support plate 42 is mounted on the bottom wall 14. A slide rail 48 longitudinally protrudes from the upper support plate 44.

In assembly, the rack 20 is installed in the receiving space 16 of the container 10 through the inlet 18. The two rows of first slide members 220 engage with the rail portions 30, with the slide slots 2244 of the upper pulleys 224 of each first slide member 220 receiving the upper slide rail 360 of the corresponding rail 30, and the slide slot 2244 of the lower pulley 224 of each first slide member 220 receiving the lower slide rail 362 of the corresponding rail 30. The bottom plate 24 of the rack 20 is supported by the supports 40. The two rows of second slide members 240 engage with the slide rails 48, with the slide slot 2464 of each pulley 246 receiving the corresponding slide rail 48. Thus, the rack 20 is movably installed in the container 10. When the rack 20 is moved to a predetermined position, the rack 20 may be tightly fastened on the upper support plates 44 by a plurality of fasteners 50, such as screws.

When the rack 20 needs to moved to gain better access to the back of the rack 20, the fasteners 50 are removed and the rack 20 is moved forward to enlarge the space of the hot aisle.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A container data center comprising:
   a mobile container comprising a top wall and a bottom wall opposite to the top wall;
   two rails attached to the top wall facing the bottom wall;
   two supports attached to the bottom wall facing the top wall, corresponding to the rails; and
   a rack received in the container; wherein the rack comprises a top plate, a bottom plate opposite to the top plate, two rows of first slide members attached to the top plate, and two rows of second slide members attached to the bottom plate;
   wherein the two rows of first slide members slidably resist against the rails, and the two rows of second slide members slidably resist against the supports;
   wherein each of the rails comprises a fixing plate substantially perpendicularly mounted to the top wall of the container, a connection plate substantially perpendicularly extending from a distal side of the fixing plate, and a first slide rail substantially perpendicularly extending from the connection plate, wherein the first slide rail resists against a corresponding row of first slide members; and
   wherein the connection plate is connected to a center line of the first slide rail to divide the first slide rail into an upper slide rail and a lower slide rail, each row of first slide members comprises two first slide members, each first slide member comprises a fixing plate and three first pulleys, two of the three first pulleys are arranged on an upper portion of the fixing plate along a line parallel to the top wall of the container to engage with the upper slide rail, the third pulley of the first pulleys is arranged under and between the two upper pulleys to engage with the lower slide rail.

2. The container data center of claim 1, wherein each first pulley defines a slide slot in a circumference of the pulley, for receiving the corresponding first slide rail.

3. The container data center of claim 1, wherein a bracket is attached to the top plate of the rack, the bracket comprises a substantially rectangular base plate attached to the top plate, and two pairs of tabs substantially perpendicularly extending up from opposite sides of the base plate, each first slide members is adjustably attached to a corresponding tab.

4. The container data center of claim 3, wherein each tab defines a long first slide slot extending up and down, two fasteners adjustably extend through the slot to adjustably fasten the fixing plate of the corresponding first slide member to the corresponding tab.

5. The container data center of claim 1, wherein a second slide rail longitudinally protrudes from a top portion of each of the supports, each row of second slide members comprise two second slide members, each second slide member comprises a bottom plate mounted on the bottom plate of the rack, two tabs perpendicularly extending from opposite sides of the bottom plate of the second slide member, and a second pulley rotatably mounted between the tabs using an axel, the second pulley slidably resists against the corresponding second slide rail.

6. The container data center of claim 5, wherein the second pulley defines a slide slot in a circumference of the pulley, for receiving the corresponding second slide rail.

7. The container data center of claim 5, wherein each second slide member is positioned at a corner of the bottom plate of the second slide member.

8. The container data center of claim 5, wherein each support is substantially I-shaped and comprises a lower support plate mounted on the bottom wall of the container, an upper support plate opposite to the lower support plate, and a plurality of connection plates perpendicularly connected between center lines of the lower and upper support plates, wherein the slide rail of each support longitudinally protrudes from a top surface of the corresponding upper support plate.

* * * * *